(12) United States Patent
Lee et al.

(10) Patent No.: US 6,248,654 B1
(45) Date of Patent: Jun. 19, 2001

(54) METHOD FOR FORMING SELF-ALIGNED CONTACT

(75) Inventors: Joo-Young Lee; Yong Jik Park, both of Kyunggi-do (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/370,880

(22) Filed: Aug. 10, 1999

(30) Foreign Application Priority Data

Aug. 10, 1998 (KR) .................................................. 98-32458

(51) Int. Cl.[7] ...................................................... H01L 21/44

(52) U.S. Cl. ........................... 438/597; 438/261; 438/263

(58) Field of Search .................................... 438/261, 647, 438/631, 636, 692, 257, 597, 263, 265; 257/316

(56) References Cited

U.S. PATENT DOCUMENTS 5,635,415 * 6/1997 Hong ..................................... 438/261

* cited by examiner

Primary Examiner—David Nelms
Assistant Examiner—David Vu
(74) Attorney, Agent, or Firm—The Law Offices of Eugene M. Lee, PLLC

(57) ABSTRACT

A method of forming a self-aligned contact in a semiconductor device comprising a semiconductor substrate and a gate line. The method comprises the steps of forming a conductive layer on an overall surface of the semiconductor substrate including the gate line, planarization-etching the conductive layer down to the gate line, and etching the conductive layer to form the contact, the etching performed at least until the contact is electrically separated from other portions of the conductive layer. The method may reduce or eliminate pad-to-gate electrode shorts by preventing exposure during etching of the gate electrode, reduce or eliminate pad-to-pad bridging by preventing generation of void regions, and reduce contact resistance by securing enough contact area between a pad and an active region in spite of misalignment of a photoresist pattern.

10 Claims, 11 Drawing Sheets

METHOD FOR FORMING SELF-ALIGNED CONTACT

BACKGROUND OF THE INVENTION

1. Field of the Invention

The present invention relates to a method for fabricating a semiconductor device, and more particularly to a method for forming a self-aligned contact in a semiconductor device.

2. Description of the Related Art

As the integration level of dynamic random access memory (DRAM) devices increases, the minimum feature size of elements and the space occupied by the elements are reduced. Misalignment may occur during the photo process used to form contact holes. As a result, the insulating layer etching process used to form the contact holes may expose a lower conductive layer, generating a short between the exposed conductive layer and a conductive layer filling a contact hole. In order to solve these problems, a self-aligned contact (referred to below as a "SAC") is suggested. If the minimum feature size of the elements is too small to secure a misalignment margin in the photo process, the SAC process should be used. However, the SAC process has a few problems, as described below.

Figure 1:
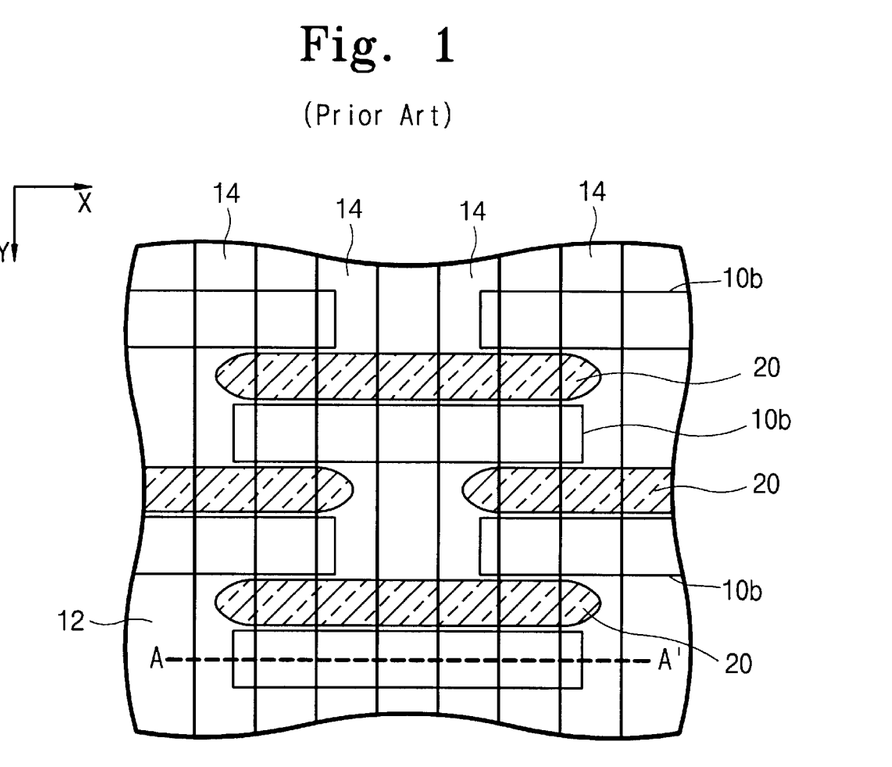
FIG. 1 is a plan view showing a DRAM device according to the prior art.

Referring to FIG. 1, gate lines 14 are grown on a semiconductor substrate in the Y-direction. An active region 10b, which is surrounded by a device isolation region 12, is formed to the X-direction (i.e., perpendicular to the gate lines 14). An interlayer insulating film is formed on the semiconductor substrate and the gate lines 14, and a bar-type photoresist pattern 20 is formed on the interlayer insulating film. Using the photoresist pattern 20 as a mask, the interlayer insulating film is etched.

Figure 2A:
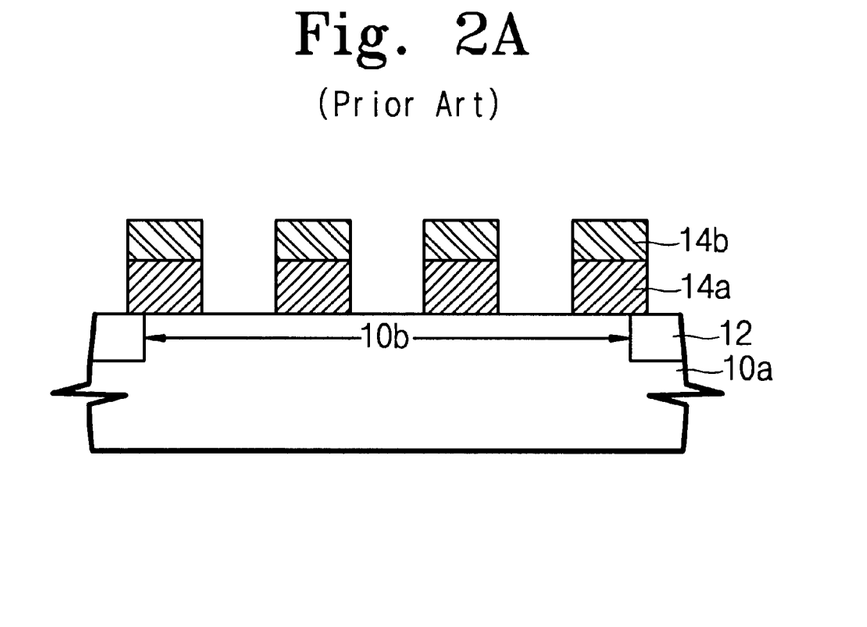
FIGS. 2A–2D are sectional views taken along a line A–A' of the device of FIG. 1 showing steps in the fabrication of the device.

Referring to FIG. 2A, an active region 10b and an inactive region 12 are shown on a semiconductor substrate 10a. The device isolation region 12 is formed on a gate oxide layer (not shown) over semiconductor substrate 10a. A conductive layer for a gate electrode and an insulating layer for a gate mask are sequentially formed. Using a mask (not shown), the insulating layer is etched to form a gate mask 14b. Using the gate mask 14b, the conductive layer is etched to form a gate electrode 14a. The gate mask may be made of silicon nitride.

Figure 2B:
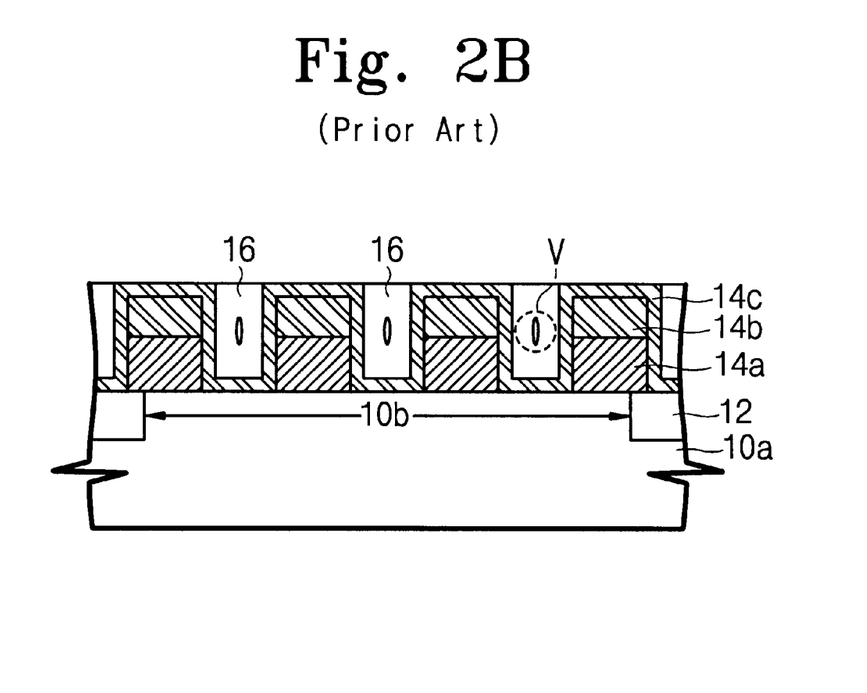

Referring to FIG. 2B, a silicon nitride layer 14c and an interlayer insulating film 16 are sequentially formed on an overall surface of the semiconductor substrate 10a including the gate electrode 14a and gate mask 14b. The interlayer insulating film 16 is planarized through a chemical mechanical polishing (CMP) process. The silicon nitride layer 14c serves as an etch-stop layer.

Figure 2C:
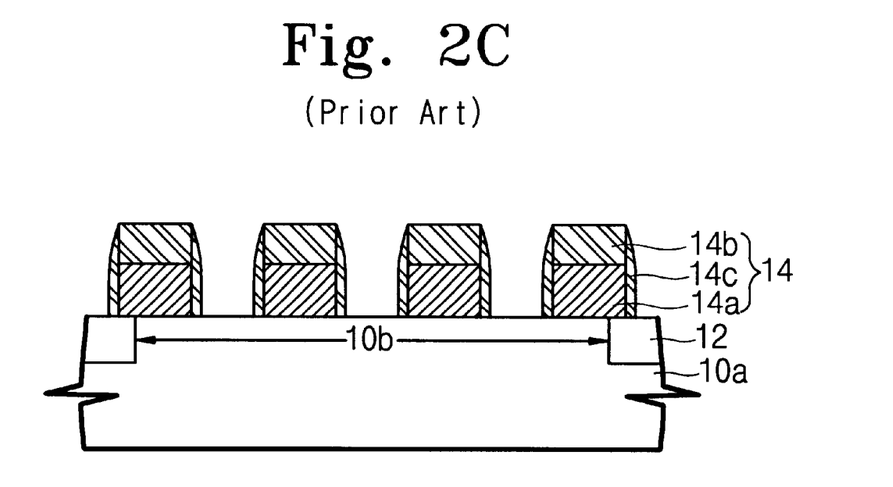

A photoresist layer is patterned on the interlayer insulating film 16, so that a photoresist pattern (not shown) is formed. Using the photoresist pattern as a mask, the interlayer insulating film 16 is etched down to a top surface of the silicon nitride layer 14c in the regions not covered by the photoresist pattern, as shown in FIG. 2C. The silicon nitride layer 14c is anisotropically etched down to a top surface of the active region 10b, so that a silicon nitride layer spacer 14c is formed on both sidewalls of the gate electrode 14a and the gate mask 14b. After formation of the gate electrode 14a and the spacer 14c, an impurity ion is implanted into the active region 10b, so that a source/drain region (not shown) is formed. Then, the photoresist pattern is removed.

Figure 2D:
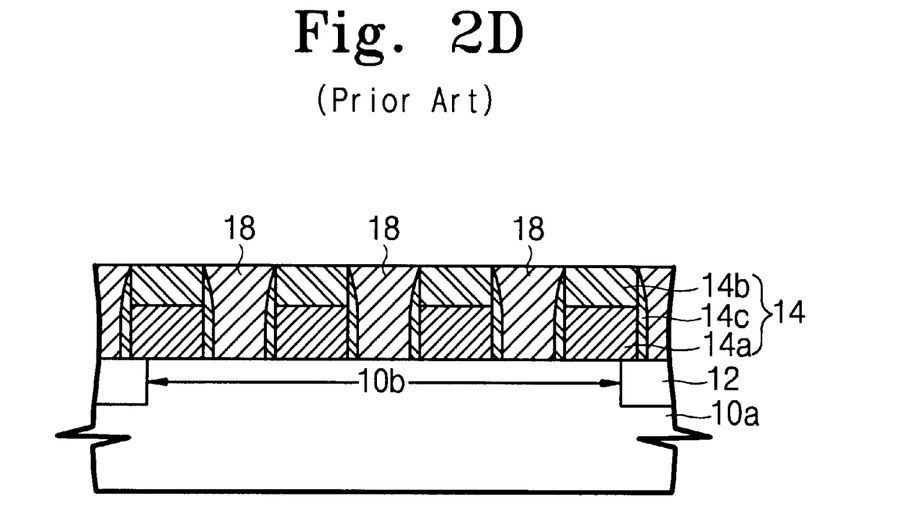

Referring to FIG. 2D, a conductive layer (for example, a polysilicon layer) is formed on the overall surface of the semiconductor substrate 10a including the spacers 14c and gate masks 14b, filling the gaps between the gates 14. The conductive layer is then planarized using a CMP process. During this process, the gate mask 14b serves as an etch-stop layer. Thus, a contact plug 18 is formed using the above SAC process.

However, this prior art method may create problems as follows:

(1) In order to expose the semiconductor substrate 10a where the contact plug 18 is formed, the interlayer insulating layer 16 and the nitride layer 14c may be overetched resulting in imperfect formation of the silicon nitride spacer 14c and exposing an edge of the gate electrode 14a. Consequently, a short may occur between the edge of the gate electrode 14a and a pad formed during subsequent processing;

(2) If the gate mask 14b and the silicon nitride layer 14c are made thick enough to accommodate overetching, the space between gates 14 may become too narrow. This narrow space makes filling the space with the interlayer insulating film 16 difficult, resulting in the formation of void regions V, as shown in FIG. 2B. Because these voids are formed in the direction of the word lines of a DRAM device, conductive areas may be electrically connected via the voids during subsequent pad formation, thereby generating undesirable pad-to-pad bridges; and (3) Because of its small width, misalignment of the bar-type photoresist pattern 20 may cause problems. If the photoresist pattern 20 is misaligned, it may cover part or all of the interlayer insulating film 16 on the active region 10b. Consequently, the contact area between the contact plug 18 to the semiconductor substrate 10a may be reduced, increasing contact resistance. In severe cases, there may be no electrical contact between the contact plug 18 and active region 10b.

SUMMARY OF THE INVENTION

The present invention provides a method for forming a self-aligned contact which may reduce or eliminate pad-to-gate electrode shorts by preventing exposure during etching of the gate electrode. The method of the invention also may reduce or eliminate pad-to-pad bridging by preventing generation of void regions, and may reduce contact resistance by securing enough contact area between a pad and an active region in spite of misalignment of a photoresist pattern.

In accordance with one aspect of the invention there is provided a method of forming a self-aligned contact in a semiconductor device comprising a semiconductor substrate and a plurality of gate lines thereon. The method comprises the steps of forming a conductive layer on an overall surface of the semiconductor substrate including the gate lines, planarization-etching the conductive layer down to a top surface of the gate lines, and etching selected portions of the conductive layer to form a plurality of self-aligned contacts that are electrically separated from one another.

The semiconductor device may comprise a device isolation layer formed on the semiconductor substrate defining an active region and an inactive region, the self-aligned contacts being formed on the active region. Each gate line may comprise a gate electrode, a gate mask, and a gate spacer. The planarization-etching process may be performed using an etch-back process or a chemical mechanical polishing process, and the gate mask may serve as an etch-stop layer in the planarization-etching process. The etching of selected portions of the conductive layer for forming the plurality of self-aligned contacts may be performed using a slope-etch process.

In accordance with another aspect of the invention there is provided a method of forming a contact on a semiconductor substrate comprising a plurality of active regions. The method comprises the steps of forming a plurality of gate lines on the semiconductor substrate, each of the gate lines comprising a gate electrode, a gate mask, and a gate spacer, depositing a conductive layer on the semiconductor substrate and the gate lines to fill spaces between the gate lines, planarization-etching the conductive layer down to a top surface of the gate mask of the gate lines, forming a mask covering the conductive layer aligned over contact formation regions, and etching exposed portions of the conductive layer to form a plurality of self-aligned contacts that are electrically separated from one another.

According to the method, etching of an interlayer insulating film is omitted. Thus, the present invention has advantages as follows:

(1) A spacer may be imperfectly formed, thus exposing the gate electrode so that a pad-to-gate electrode short is generated. However, this type of pad-to-gate electrode short may be reduced or eliminated in the present invention;

(2) The generation of void regions may be reduced or eliminated without increasing the thickness of the gate mask, thereby reducing or eliminating pad-to-pad bridging in the present invention; and (3) The photoresist pattern may be formed to secure enough contact area between a pad and an active region in spite of misalignment of the photoresist pattern, thereby reducing or eliminating an increase in contact resistance therebetween.

BRIEF DESCRIPTION OF THE DRAWINGS

The above features and advantages of the invention will become apparent upon reference to the following detailed description of specific embodiments and the attached drawings, of which.

DESCRIPTION OF SPECIFIC EMBODIMENTS

Now, specific embodiments of the present invention will be described with reference to the drawings. Korean application no. 98-32458, filed Aug. 10, 1998, is hereby incorporated by reference as if fully set forth herein.

Figure 3:
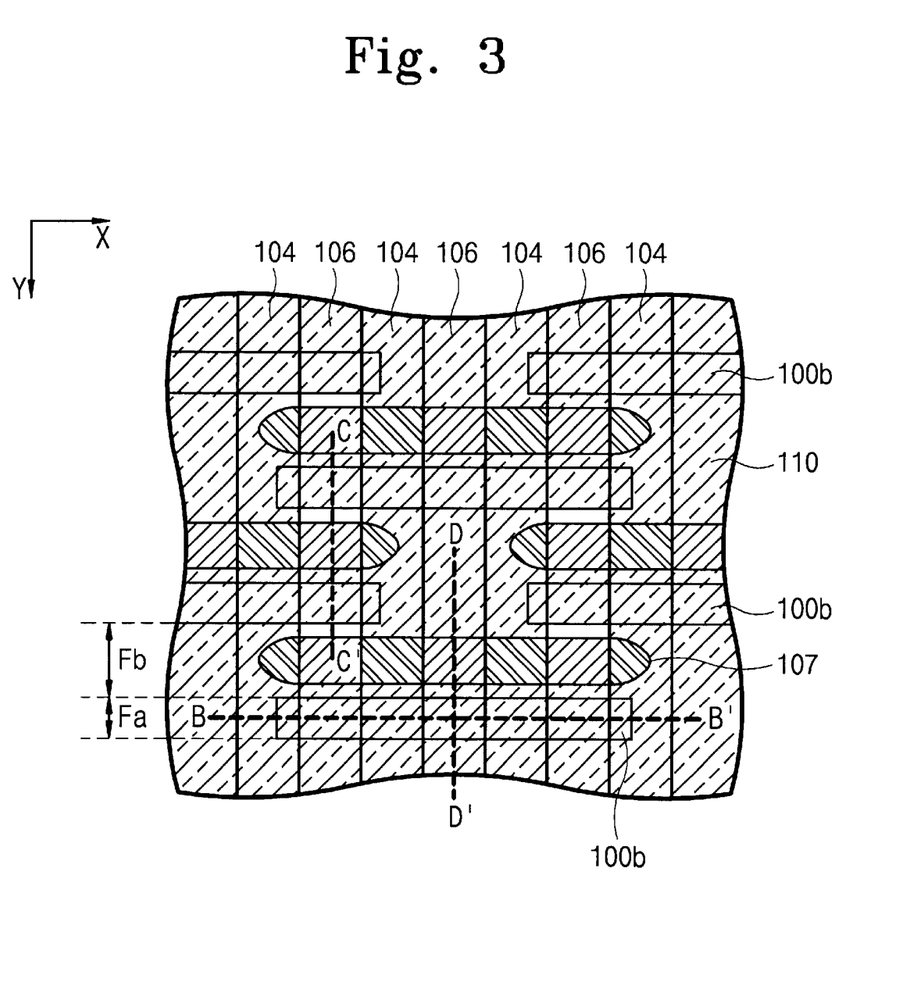
FIG. 3 is a plan view showing a DRAM device according to the present invention.

Referring to FIG. 3, gate lines 104 are formed in the Y-direction on a semiconductor substrate and active regions 100b are formed in the X-direction. The active regions 100b are surrounded by a device isolation region formed in the X-direction (i.e., perpendicular to the gate lines 104). A conductive layer 106 is formed between the gate lines 104, and a photoresist pattern 110 is formed on the conductive layer 106 and the gate lines 104. The photoresist pattern 110 exposes a portion of the gate lines 104. The photoresist pattern also exposes a portion of the conductive layer 106, so that the exposed conductive layer may be etched to form a contact plug and the contact plugs may be electrically separated from one another.

FIGS. 4A–4D, FIGS. 5A–5D, and FIGS. 6A–6D are cross sectional diagrams showing sequentially a method for fabricating a semiconductor device according to an embodiment of the present invention. FIGS. 4A–4D show cross sectional views taken along a line B–B' of FIG. 3, FIGS. 5A–5D show cross sectional views taken along a line C–C' of FIG. 3, and FIGS. 6A–6D show cross sectional views taken along a line D–D' of FIG. 3.

Figure 4A:
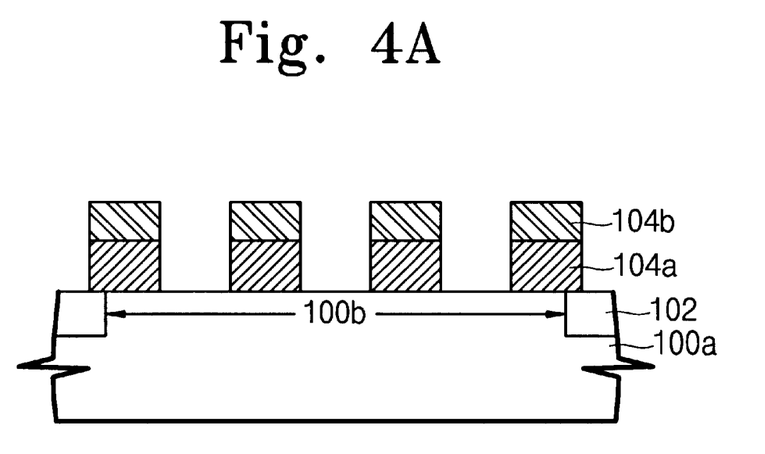
FIGS. 4A–4D are sectional views taken along a line B–B' of the device of FIG. 3 showing steps in the fabrication of the device.
Figure 5A:
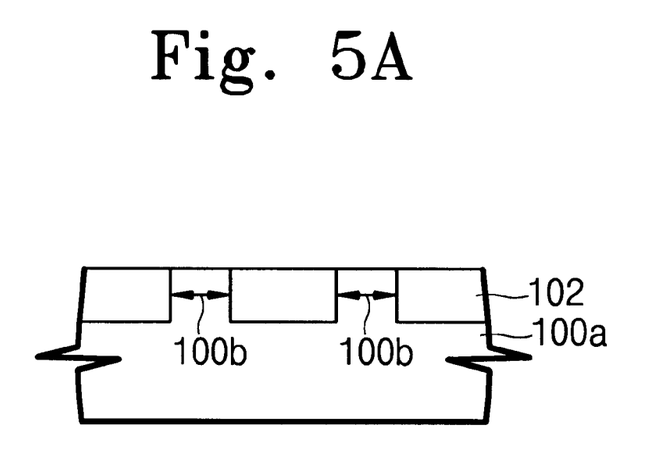
FIGS. 5A–5D are sectional views taken along a line C–C' of the device of FIG. 3 showing steps in the fabrication of the device.
Figure 6A:
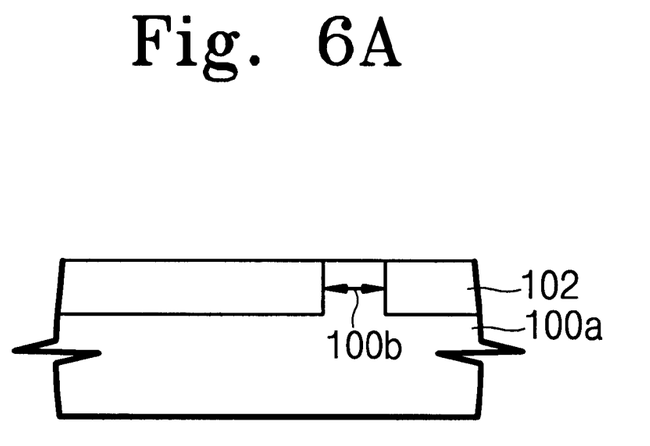
FIGS. 6A–6D are sectional views taken along a line D–D' of the device of FIG. 3 showing steps in the fabrication of the device.

Referring to FIG. 4A, FIG. 5A, and FIG. 6A, a device isolation region defining an active region 100b and an inactive region 102 is formed on a semiconductor substrate 100a. Assuming a minimum feature size F, where F is half the sum of width Fa of the active region 100b and width Fb of the inactive region 102, as shown in FIG. 3 (that is, F=(Fa+Fb)/2). In the present invention, the width Fa is smaller than width Fb. A conductive layer for a gate electrode and an insulating layer for a gate mask are sequentially formed on a gate oxide layer (not shown) over the semiconductor substrate 100a. Using a mask (not shown) defining the active region and the inactive region, the insulating layer is etched to form a gate mask 104b, shown in FIG. 4A. Using the gate mask 104b, the conductive layer is etched to form a gate electrode 104a. The gate mask 104b is preferably made of silicon nitride. Since a planarization-etching process of an interlayer insulating film is omitted in the present invention, overetching may be disregarded. Accordingly, the thickness of the silicon nitride layer 104b may be relatively smaller than that required in the prior art. The resulting structure is shown in FIG. 4A, whereas only the device isolation region 102 is shown in FIG. 5A and FIG. 6A due to the cross sections shown in these figures.

Figure 4B:
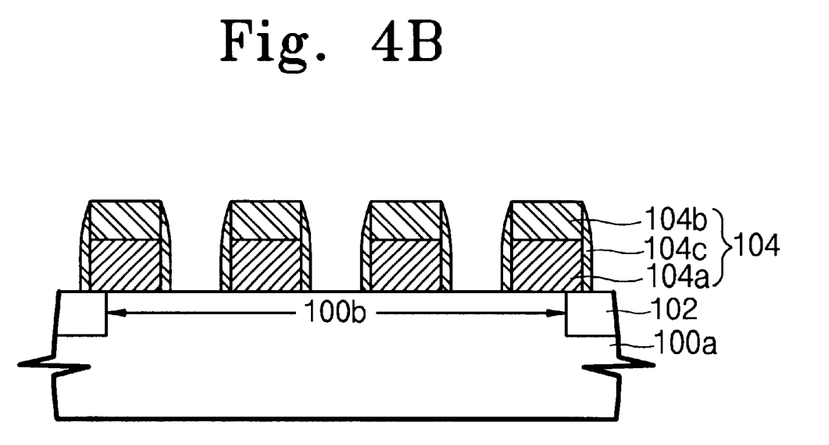
Figure 5B:
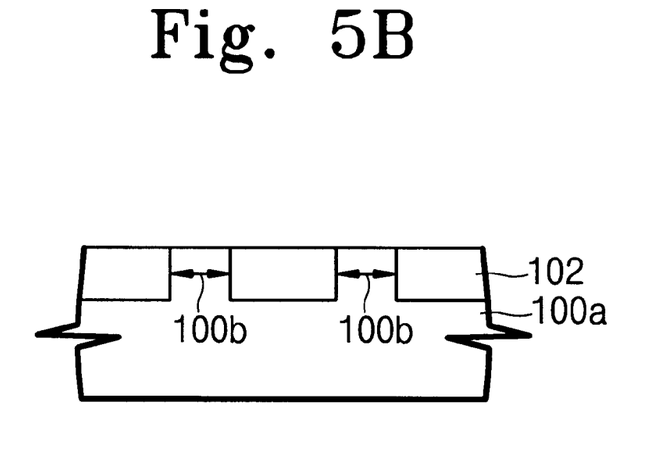
Figure 6B:
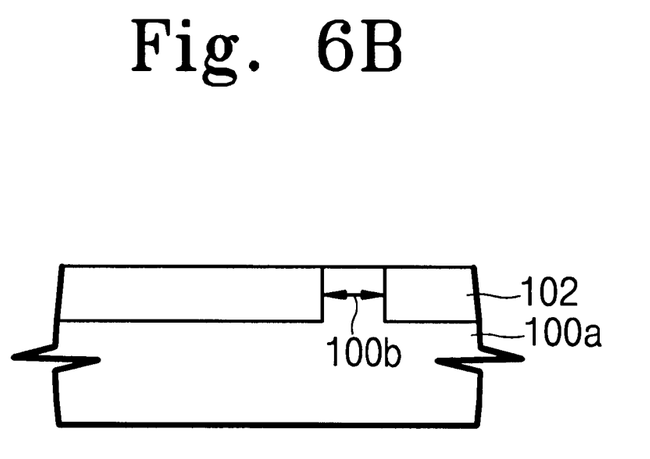

Referring to FIG. 4B, FIG. 5B, and FIG. 6B, a layer, preferably silicon nitride, is formed on an overall surface of the semiconductor substrate 100b including the structure shown in FIG. 4A, FIG. 5A, and FIG. 6A. Then, the silicon nitride layer is anisotropically etched down to a top surface of the active region 100b on both sides of the gate electrode 104a, so that a nitride layer spacer 104c is formed on both sidewalls of the gate mask 104b and the gate electrode 104a. Thus, gate lines 104 as shown in FIG. 3 are formed. The spacer 104c may be made of silicon dioxide ($SiO_2$) in the present invention. The resulting structure is shown in FIG. 4B, whereas only the device isolation region 102 is shown in FIG. 5B and FIG. 6B due to the cross sections shown in these figures. It should be noted that during this process, only the cell region of the dynamic random access memory (DRAM) device being fabricated is exposed, whereas the core and peripheral regions of the device are covered with a photoresist layer.

Figure 4C:
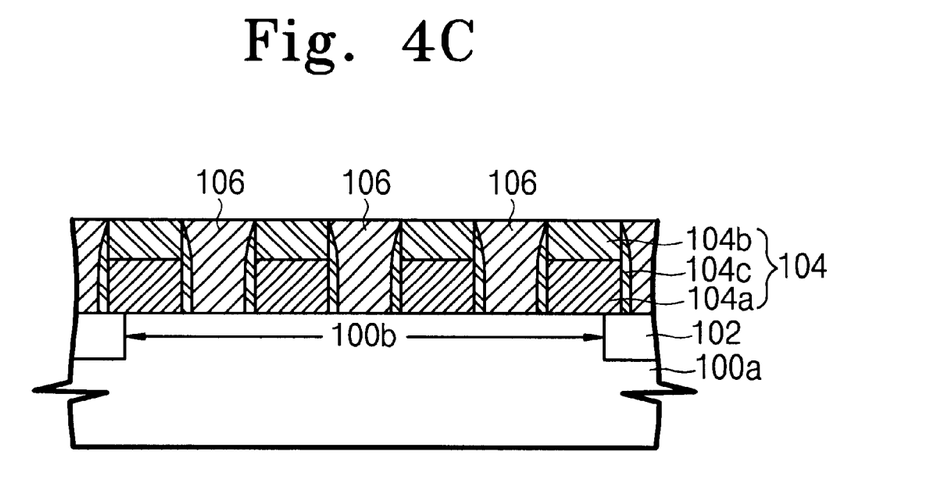
Figure 5C:
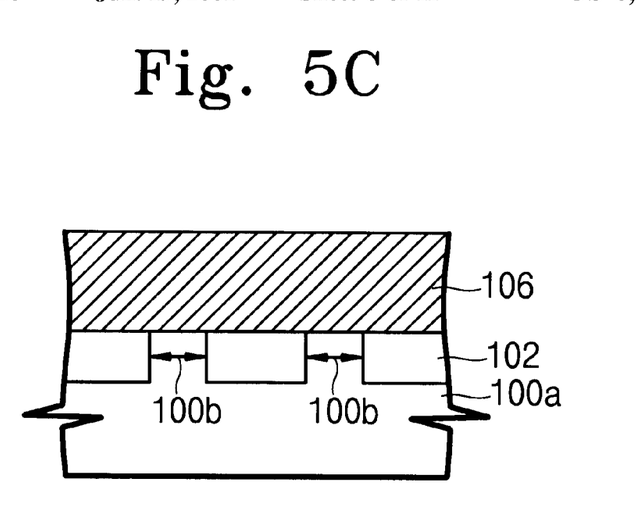
Figure 6C:
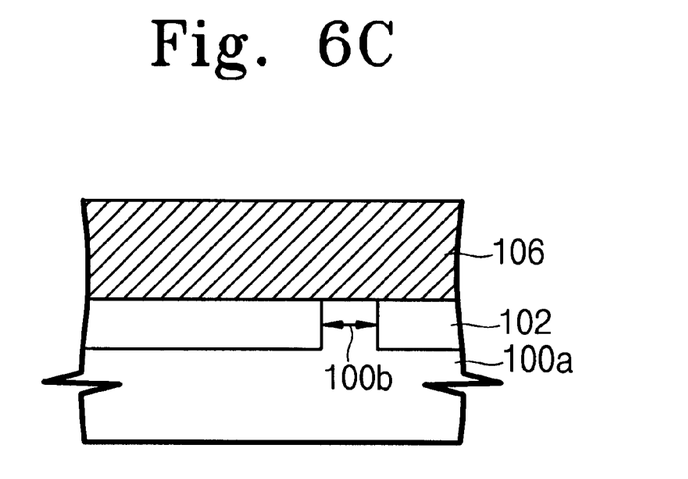

Referring to FIG. 4C, FIG. 5C, and FIG. 6C, a conductive layer 106 (for example, a polysilicon layer) is formed on an overall surface of the semiconductor substrate 100a including the structure of FIG. 4B, FIG. 5B, and FIG. 6B. The conductive layer 106 is planarization-etched down to a top surface of the gate mask 104b using an etch-back process or a chemical mechanical polishing (CMP) process. Since the conductive layer 106 is formed only between the gate lines 104, the conductive layers are electrically separated by the gate lines 104. The resulting structure is shown in FIG. 4C, whereas only the device isolation region 102 and conductive layer 106 are shown in FIG. 5C and FIG. 6C due to the cross sections shown in these figures.

Figure 4D:
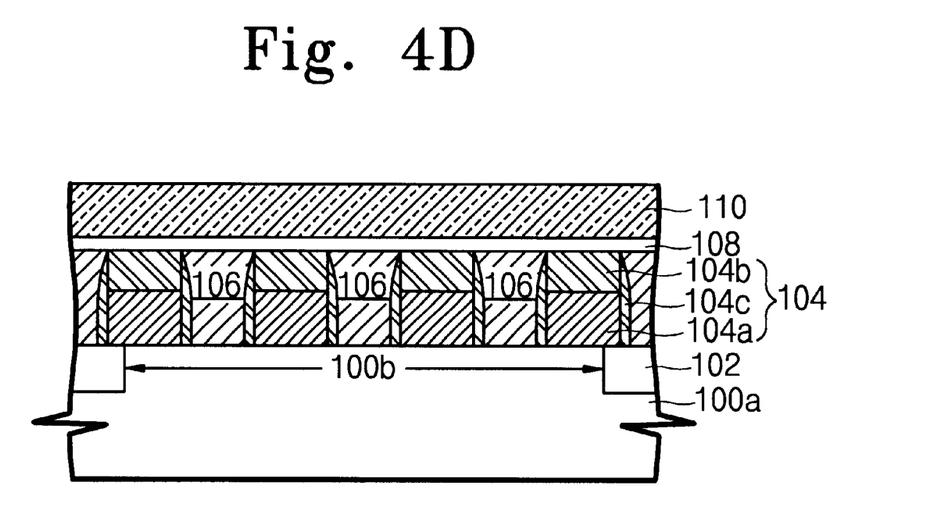
Figure 5D:
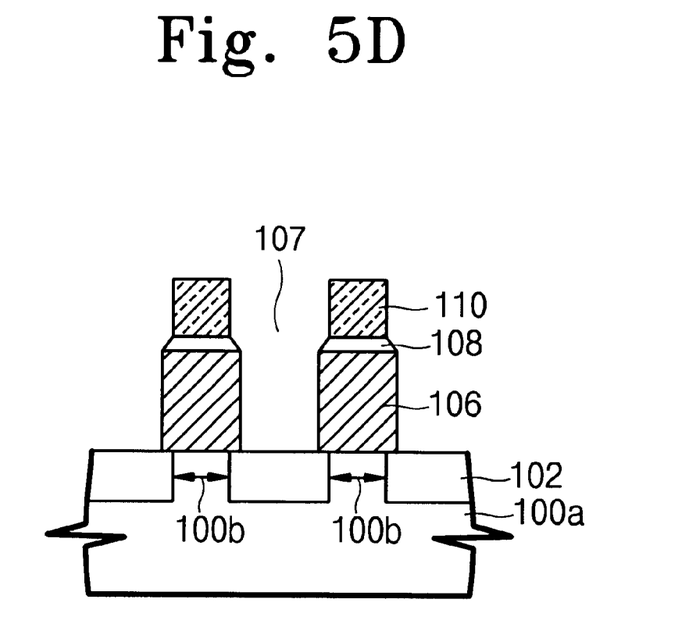
Figure 6D:
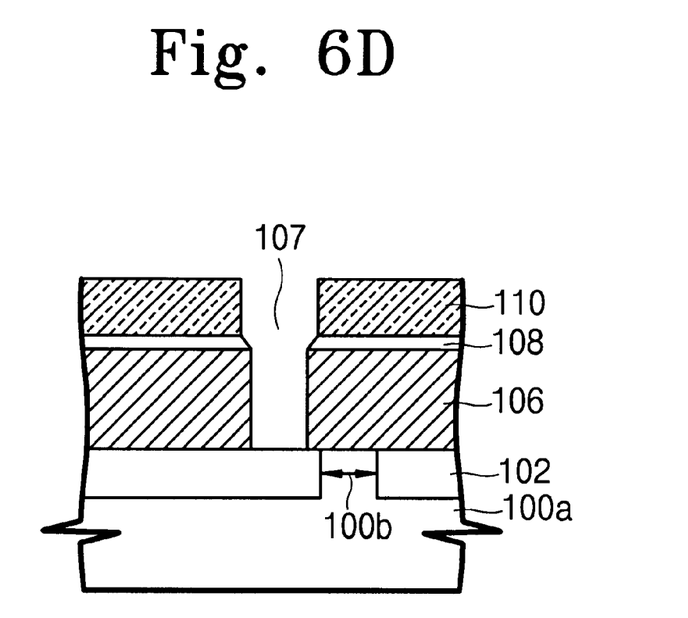

An anti-reflective coating film 108 (referred to below as an ARC film) and a photoresist layer 110 may be sequentially formed on the conductive layer 106 and the gate lines 104, as shown in FIG. 4D, FIG. 5D, and FIG. 6D. Afterwards, the photoresist layer 110 may be patterned using a conventional photo-etching process and the ARC film 108 may be etched using a conventional etching process, so that a photoresist pattern is formed to define a pad formation region which is covered by the photoresist pattern. The photoresist pattern exposes a portion of the conductive layer 106 and the gate lines 104. It is desirable that the photoresist pattern have the minimum feature size. The ARC film 108 may promote formation of a thin pattern. FIG. 3 shows a plan view of the resulting structure following this step.

As shown in FIG. 3, portions of the conductive layer 106 exposed by the photoresist pattern are etched until a top surface of the active region 100b between the gate lines 104 is exposed, so that contact plugs 106 are formed that are electrically separated from one another. The etching of the exposed conductive layer may be performed using a slope-etch process and the gate spacer 104c and the gate mask 104b serve an etch-stopper, protecting the gate electrode 104. The slope-etch process is advantageously employed to ensure sufficient process margin. The core and peripheral regions of the DRAM device are not covered with the photoresist layer during this etching process. However, depending on process condition, the photoresist layer may be left on the core and peripheral regions for the formation of device resistance.

Figure 7:
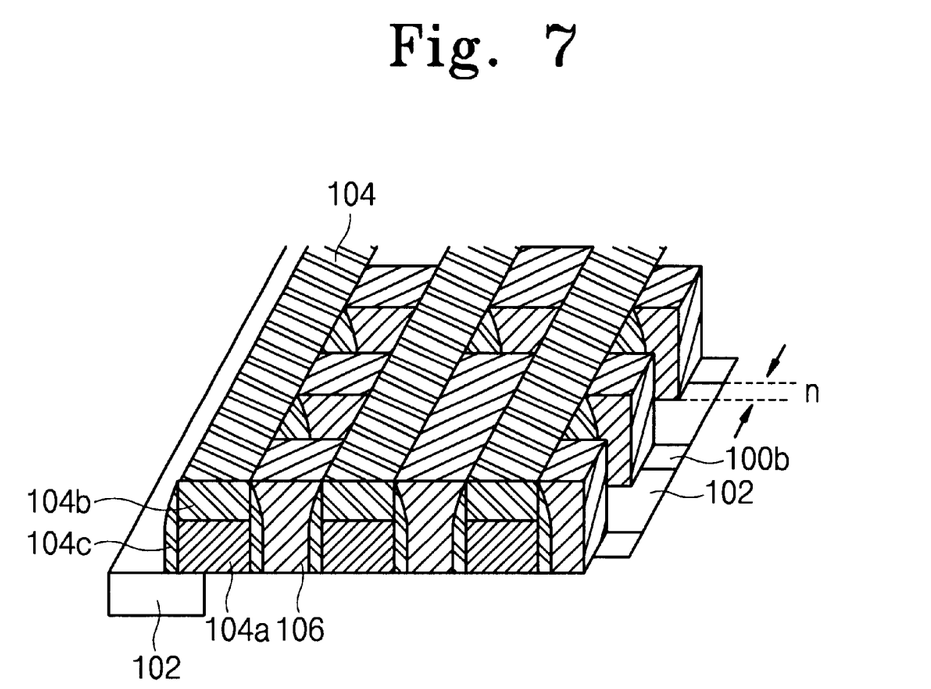
FIG. 7 is a three-dimensional view showing a method for fabricating a DRAM device according to the present invention.

FIG. 4D, FIG. 5D, and FIG. 6D show the resulting structure after all of the steps have been completed. FIG. 7 shows the resulting structure after removal of the photoresist pattern (that is, photoresist layer 110 and ARC film 108).

Referring to FIG. 7, a device isolation region defining an active region 100b and an inactive region 102 is formed on a semiconductor substrate. A gate electrode 104a and a gate spacer 104c are sequentially formed on a gate oxide layer (not shown) over the semiconductor substrate. A gate spacer 104c is formed on both sidewalls of the gate electrode 104a and the gate mask 104b. Gate lines 104 comprise a gate electrode 104a, a gate mask 104b, and a gate spacer 104c. Contact plugs 106 which are electrically connected to active regions 100b are formed between the gate lines 104, and are electrically isolated from other contact plugs.

Referring to FIG. 3 again, as mentioned above, Fa (the width of the active region 100b) is smaller than Fb (the width of the inactive region 102). The photoresist pattern 110 is preferably a contact-type, rather than a bar-type. Namely, the photoresist pattern 110 has openings 107 exposing selected portions of the conductive layer 106 outside of the active region 100b and covers selected portions of the conductive layer 106 over contact the forming region. The openings 107 substantially resemble the configuration of the active region 100b and are located in parallel therewith. The etching using the photoresist pattern is preferably performed using the slope-etch process. Thus, misalignment margin between the contact plug 106 and the active region 100b can be secured beyond the technical limitation of a photo apparatus. The secured misalignment margin is shown as reference symbol "n" in FIG. 7.

The etching of an interlayer insulating film may be omitted in the present invention. Thus, the occurrence of pad-to-gate electrode shorts, the formation of void regions, and the occurrence of pad-to-pad bridging may be reduced or avoided. It is possible to stably form a photoresist pattern and to secure enough contact area between a contact plug and an active region in spite of misalignment of the photoresist pattern, thereby reducing or avoiding an increase in contact resistance therebetween.

Thus, a method for forming a self-aligned contact in a semiconductor device has been described according to the present invention. While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A method of forming a self-aligned contact in a semiconductor device comprising a semiconductor substrate and a plurality of gate lines thereon, said semiconductor substrate having active regions and a device isolation region, said method comprising:

forming a conductive layer over an overall surface of said semiconductor substrate including said gate lines;

planarization-etching said conductive layer down to a top surface of said gate lines; and etching selected portions of said conductive layer to form a plurality of self-aligned contacts, that are electrically separated from one another, said self-aligned contacts being in contact with said active regions and in contact with selected portions of said device isolation region.

2. The method of claim 1, wherein each of said gate lines comprises a gate electrode, a gate mask, and a gate spacer.

3. The method of claim 2, wherein said planarization-etching step comprises a process selected from the group consisting of an etch-back process and a chemical mechanical polishing process.

4. The method of claim 2, wherein said gate mask serves as an etch-stop layer in said planarization-etching step.

5. The method of claim 2, wherein said step of etching selected portions of said conductive layer comprises using a slope-etch process.

6. A method of forming a contact on a semiconductor substrate comprising a plurality of active regions, said method comprising:

forming a plurality of gate lines on said semiconductor substrate, each of said gate lines comprising a gate electrode, a gate mask, and a gate spacer;

depositing a conductive layer on said semiconductor substrate and said gate lines to fill spaces between said gate lines;

planarization-etching said conductive layer down to a top surface of said gate mask of said gate lines;

forming a mask pattern on said conductive layer, said mask pattern having a plurality of openings to expose selected portions of said conductive layer outside of said active regions and covering selected portions of said conductive layer over the contact forming region; and etching exposed portions of said conductive layer to form a plurality of self-aligned contacts that are electrically separated from one another.

7. The method of claim 6, wherein said planarization-etching step comprises a process selected from the group consisting of an etch-back process and a chemical mechanical polishing process.

8. The method of claim 6, wherein said gate mask serves as an etch-stop layer in said planarization-etching step.

9. The method of claim 6, wherein said step of etching exposed portions of said conductive layer comprises using a slope-etch process.

10. The method of claim 6, wherein said openings of said mask pattern substantially resemble the configuration of said active regions and are located in parallel alignment with said active regions.

* * * * *